United States Patent
Ishihara et al.

(10) Patent No.: US 10,251,277 B2
(45) Date of Patent: Apr. 2, 2019

(54) RESIN-SEALED MODULE

(71) Applicant: Murata Manufacturing Co., Ltd., Kyoto (JP)

(72) Inventors: Shota Ishihara, Kyoto (JP); Tetsuya Oda, Kyoto (JP); Tatsunori Kan, Kyoto (JP); Kenichi Atsuchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 30 days.

(21) Appl. No.: 15/336,941

(22) Filed: Oct. 28, 2016

(65) Prior Publication Data

US 2017/0048982 A1 Feb. 16, 2017

Related U.S. Application Data

(63) Continuation of application No. PCT/JP2015/061690, filed on Apr. 16, 2015.

(30) Foreign Application Priority Data

May 13, 2014 (JP) .................................. 2014-099643

(51) Int. Cl.
*H05K 1/18* (2006.01)
*H05K 3/34* (2006.01)
(Continued)

(52) U.S. Cl.
CPC ............ *H05K 1/185* (2013.01); *H05K 1/111* (2013.01); *H05K 3/34* (2013.01); *H05K 3/3442* (2013.01);
(Continued)

(58) Field of Classification Search
CPC .................. H05K 1/111; H05K 1/185; H05K 2201/09663; H05K 2201/10431; H05K 2201/10507; H05K 2201/10522; H05K 2201/10636; H05K 2201/10977; H05K 2203/048; H05K 2203/1316; H05K 3/284; H05K 3/34
See application file for complete search history.

(56) References Cited

U.S. PATENT DOCUMENTS

| | | | |
|---|---|---|---|
| 5,683,788 A * | 11/1997 | Dugan | H05K 1/0295 174/261 |
| 5,704,287 A * | 1/1998 | Omori | B05C 17/06 101/127.1 |
| 7,084,353 B1 * | 8/2006 | Downes | H05K 1/111 174/255 |

FOREIGN PATENT DOCUMENTS

| | | |
|---|---|---|
| JP | S59-36268 U | 3/1984 |
| JP | S6013764 U | 1/1985 |
| (Continued) | | |

OTHER PUBLICATIONS

International Search report in PCT/JP2015/061690 dated Jul. 21, 2015.

(Continued)

*Primary Examiner* — Yuriy Semenenko
(74) *Attorney, Agent, or Firm* — Pearne & Gordon LLP

(57) ABSTRACT

A bridge section 12 is disposed in an area where mounting sections 11 are opposed to each other such that it is displaced toward a predetermined side. Accordingly, even if the line width of the bridge section 12 is formed larger than that in the related art, the self-alignment phenomenon can occur appropriately in a reflow process. It is thus possible to provide a resin-sealed module having high resin-charging properties and including a circuit substrate on which the bridge section 12 is not broken even if the size of a common land electrode 10 is reduced in accordance with a smaller size of a circuit component 5 and on which a sufficient gap between plural circuit components 5 mounted on the circuit substrate is reliably secured.

20 Claims, 9 Drawing Sheets

(51) Int. Cl.
*H05K 1/11* (2006.01)
*H05K 3/28* (2006.01)

(52) U.S. Cl.
CPC ... *H05K 3/284* (2013.01); *H05K 2201/09663* (2013.01); *H05K 2201/10431* (2013.01); *H05K 2201/10507* (2013.01); *H05K 2201/10522* (2013.01); *H05K 2201/10636* (2013.01); *H05K 2201/10977* (2013.01); *H05K 2203/048* (2013.01); *H05K 2203/1316* (2013.01); *Y02P 70/611* (2015.11); *Y02P 70/613* (2015.11)

(56) References Cited

FOREIGN PATENT DOCUMENTS

| | | |
|---|---|---|
| JP | H0178066 U | 5/1989 |
| JP | H02-027758 U | 2/1990 |
| JP | H04317386 A | 11/1992 |
| JP | 2000228574 A | 8/2000 |
| JP | 2002319747 A | 10/2002 |
| JP | 2002353604 * | 12/2002 |
| JP | 2002353604 A | 12/2002 |
| JP | 2003069163 A | 3/2003 |
| JP | 2004172176 A | 6/2004 |
| JP | 2005072482 A | 3/2005 |
| JP | 2006237320 A | 9/2006 |
| JP | 2009124021 A | 6/2009 |

OTHER PUBLICATIONS

Written Opinion in PCT/JP2015/061690 dated Jul. 21, 2015.
Japanese Office Action for 2016-519173 dated Jan. 16, 2018.

\* cited by examiner

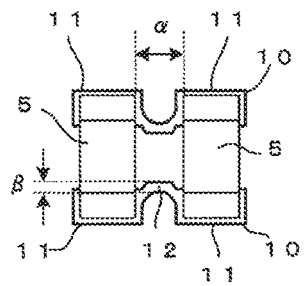
FIG. 6A
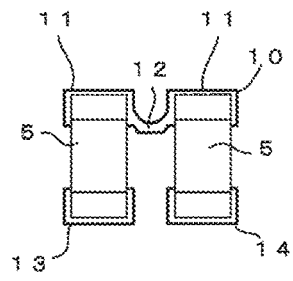
FIG. 6B
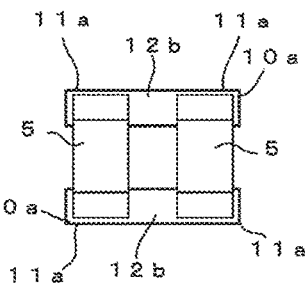
FIG. 6C
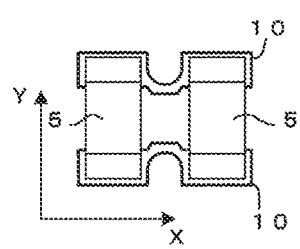
FIG. 7A
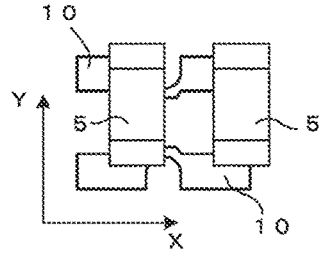
FIG. 7B
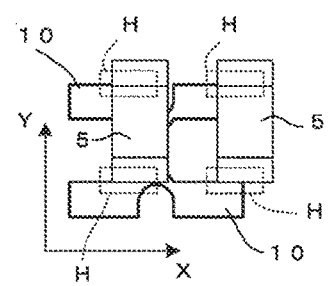
FIG. 7C
FIG. 8
|  | DESIGN GAP (μm) | COMMON LAND ELECTRODE | LINE WIDTH OF BRIDGE SECTION (μm) | AVERAGE GAP (μm) | MINIMUM GAP (μm) | 3σ | AVERAGE −3σ |
|---|---|---|---|---|---|---|---|
| (1) | 125 | BOTH SIDES | 40 | 107 | 80 | 55 | 52 |
| (2) | 125 | BOTH SIDES | 80 | 114 | 80 | 51 | 63 |
| (3) | 125 | BOTH SIDES | 105 | 101 | 87 | 43 | 58 |
| (4) | 125 | ONE SIDE | 80 | 115 | 87 | 53 | 63 |
| (5) | 125 | BOTH SIDES | 150 | 103 | 58 | 71 | 32 |

PRIOR ART

RESIN-SEALED MODULE

This application is a continuation of International Application No. PCT/JP2015/061690 filed on Apr. 16, 2015 which claims priority from Japanese Patent Application No. 2014-099643 filed on May 13, 2014. The contents of these applications are incorporated herein by reference in their entireties.

BACKGROUND OF THE DISCLOSURE

Field of the Disclosure

The present disclosure relates to a resin-sealed module formed by resin-sealing plural circuit components mounted on a circuit substrate.

Description of the Related Art

Hitherto, the following resin-sealed module, for example, has been provided. The resin-sealed module includes a circuit substrate, plural circuit components, and a resin sealing layer. On a first main surface of the circuit substrate, plural land electrodes are formed. The plural circuit components are mounted on the land electrodes formed on the first main surface of the circuit substrate. The resin sealing layer is provided on the first main surface so as to cover the plural circuit components. The plural circuit components are mounted on the first main surface of the circuit substrate by soldering outer electrodes of the circuit components to the land electrodes.

In a resin-sealed module, outer electrodes of some of the plural circuit components may be set at the same potential. In this case, the plural outer electrodes set at the same potential may be soldered to a land electrode used for the plural outer electrodes (hereinafter referred to as a "common land electrode") (see, for example, Patent Document 1).

FIG. 14 is a plan view illustrating a known common land electrode. As shown in FIG. 14, a known common land electrode 500 includes plural mounting sections 501 and bridge sections 502. The plural mounting sections 501 are formed in a rectangular shape and are disposed linearly. The bridge sections 502 are each disposed in an area where mounting sections 501 are opposed to each other so as to serve as a bridge for interconnecting the mounting sections 501. In the example shown in FIG. 14, two common land electrodes 500 are formed on a first main surface of a circuit substrate. The two common land electrodes 500 are arranged in parallel with each other such that each of the mounting sections 501 of one common land electrode 500 and an associated mounting section 501 of the other common land electrode 500 are disposed in parallel.

If a circuit component 503 is constituted by a chip passive element formed in a rectangular parallelepiped shape (hereinafter referred to as a "chip component"), such as an inductor, a capacitor, and a resistor, it is connected to the common land electrode 500 in the following manner, for example. An outer electrode 504 disposed at one end portion of the circuit component 503 is soldered to one of two mounting sections 501 of the common land electrodes 500 disposed in parallel. An outer electrode 504 disposed at the other end portion of the circuit component 503 is soldered to the other one of the mounting sections 501 of the common land electrodes 500 disposed in parallel. Similarly, among the three mounting sections 501 arranged in the top-bottom direction in FIG. 14, as well as to the mounting section 501 at the top position, an outer electrode 504 of a circuit component 503 is also connected to the mounting section 501 at the intermediate position and to the mounting section 501 at the bottom position, though they are not shown in FIG. 14. As a result, the three circuit components 503 are connected in parallel with each other.

Generally, circuit components 503 such as chip components are mounted on land electrodes including the common land electrode 500 on a circuit substrate in the following manner, for example. A solder paste is applied to each land electrode, and each circuit component 503 is temporarily fixed on a predetermined land electrode. Then, the circuit component 503 on the land electrode is heated in a reflow process. Due to the melting of solder in the reflow process, the outer electrodes 504 of each circuit component 503 are connected to the corresponding land electrode.

When connecting each circuit component 503 to a corresponding land electrode, the circuit component 503 is positioned on the corresponding land electrode and is temporarily fixed thereto by a component mounter. In this case, when positioning the circuit component 503 on the land electrode, misalignment may occur due to the position precision of a component mounter in positioning components. However, even with the occurrence of misalignment in the temporarily fixed circuit component 503, the following so-called self-alignment phenomenon is produced. Surface tension generated when solder on the land electrode melts in the reflow process is applied to the circuit component 503, so that the circuit component 503 moves toward the land electrode on which a large amount of molten solder is positioned, thereby offsetting the misalignment. Accordingly, even upon the occurrence of misalignment when temporarily fixing the circuit component 503 on the land electrode, the circuit component 503 moves back to the design position due to the self-alignment phenomenon, which is produced when a solder paste applied to the land electrode melts in the reflow process, thereby offsetting the misalignment.

However, in a case in which the outer electrodes 504 of the plural circuit components 503 are soldered to the common land electrode 500, such as that shown in FIG. 14, the following problem may occur. The common land electrode 500 includes the plural mounting sections 501. Depending on a direction of the misalignment of a circuit component 503 to be temporarily fixed on the common land electrode 500, the surface tension of molten solder on the mounting section 501 adjacent to that on which the circuit component 503 should normally be disposed (hereinafter such a mounting section will be referred to as a "target mounting section") may act more strongly on the circuit component 503 than that on the target mounting section. Thus, the temporarily fixed circuit component 503 with some misalignment may move toward the mounting section 501 adjacent to the target mounting section 501, which may increase the misalignment to an even greater amount.

If there is a misalignment in a circuit component 503 toward an adjacent mounting section 501 after the reflow process, the gap (distance) between the misaligned circuit component 503 and the circuit component 503 disposed on the adjacent mounting section 501 is reduced. If the gap between the circuit components 503 is reduced, resin-charging properties in charging resin between the circuit components 503 are decreased. Accordingly, when forming a resin sealing layer used for resin-sealing circuit components mounted on a first main surface of the circuit substrate, the resin may not fill properly a small gap between circuit components 503, which may produce hollows in the resin sealing layer.

As a result, when a resin-sealed module with hollows in a resin sealing layer is mounted on an outer substrate, such as a mother substrate, the following problem may occur. Due to the heat in the reflow process, the air or moisture within the hollows formed in the resin sealing layer rapidly expands, that is, the so-called popcorn phenomenon may occur. Additionally, the reliability of the resin-sealed module may also be decreased.

Hence, in order to prevent the occurrence of the misalignment of the plural circuit components 503 to be connected to the common land electrode 500, the common land shown in FIG. 14 is formed in the following manner. The line width of the bridge sections 502 positioned on a straight line (imaginary line) L indicated by the long dashed dotted line in FIG. 14 is formed smaller than the width of the mounting sections 501. The straight line L connects the centers of the edges of mounting sections 501 in the area where the mounting sections 501 are opposed to each other. The direction in which the distance between opposing mounting sections 501 is minimized is indicated by the straight line L.

It is now assumed that a circuit component 503 to be connected to a predetermined mounting section 501 of the common land electrode 500 is temporarily fixed in a state in which it is misaligned toward an adjacent mounting section 501. In this state, when molten solder on the mounting section 501 melts, the following misalignment may occur in the circuit component 503. Due to the generation of the surface tension of molten solder on the adjacent mounting section 501, the circuit component 503 moves toward this adjacent mounting section 501 by taking the shortest route. Accordingly, the circuit component 503 may move toward the adjacent mounting section 501 by passing on the straight line L where the distance between the adjacent mounting sections 501 is minimized.

However, since the line width of the bridge sections 502 positioned on the straight line L is formed smaller than the width of the mounting sections 501, as shown in FIG. 14, the amount of molten solder on the bridge sections 502 is smaller than that on the mounting sections 501. Accordingly, if the circuit component 503 is misaligned toward the adjacent mounting section 501 and is temporarily fixed on the bridge section 502 such that it partially overlaps the bridge section 502, the surface tension of molten solder acts on the misaligned circuit component 503 in the following manner. As the amount of molten solder is greater, surface tension becomes stronger. Thus, the surface tension generated by the molten solder acting in the direction toward the target mounting section 501 becomes stronger than that toward the adjacent mounting section 501 (bridge section 502). As a result, due to the occurrence of the self-alignment phenomenon, the circuit component 503 is disposed on the target mounting section 501.

Patent Document 1: Japanese Unexamined Patent Application Publication No. 4-317386 (paragraph 0012, FIG. 1, etc.)

BRIEF SUMMARY OF THE DISCLOSURE

Nowadays, in accordance with a decrease in the size of circuit components 503 such as chip components, the size of mounting sections 501 of a common land electrode 500 and the line width of bridge sections 502 are also becoming smaller. Accordingly, the bridge sections 502 may be broken when forming electrode patterns of the common land electrode 500. On the other hand, however, if the size of the mounting sections 501 is reduced while the line width of the bridge sections 502 is maintained at a sufficient width in order to prevent the occurrence of a break in the bridge sections 502, the boundaries between the mounting sections 501 and the bridge sections 502 are eliminated, and the self-alignment phenomenon may not be effectively produced. That is, during the reflow process, a circuit component 503 may move toward a bridge section 502 (adjacent mounting section 501), and as a result, the gap between circuit components 503 may be decreased.

This disclosure has been made in view of the above-described problem. It is an object of the present disclosure to provide a resin-sealed module having high resin-charging properties and including a circuit substrate on which a bridge section is not broken even if the size of a common land electrode is reduced in accordance with a smaller size of circuit components and on which a sufficient gap between plural circuit components mounted on the circuit substrate is reliably secured.

In order to achieve the above-described object, a resin-sealed module of the present disclosure is configured as follows. The resin-sealed module is formed by resin-sealing a plurality of circuit components mounted on a circuit substrate. The resin-sealed module includes a common land electrode formed on a first main surface of the circuit substrate. Outer electrodes of the plurality of circuit components which are set at the same potential are connected to the common land electrode. The common land electrode includes a plurality of mounting sections disposed side by side and a bridge section disposed in an area where the mounting sections are opposed to each other so as to interconnect the mounting sections. One of the outer electrodes of each of the circuit components is connected to a corresponding one of the mounting sections on a one-to-one correspondence basis by using solder. The bridge section is displaced toward one of sides of a direction perpendicular to an imaginary line which connects centers of opposing mounting sections.

In the resin-sealed module configured as described above, the common land electrode formed on the first main surface of the circuit substrate includes a plurality of mounting sections disposed side by side and a bridge section disposed in an area where the mounting sections are opposed to each other so as to interconnect the mounting sections. By connecting one of the outer electrodes of each of the circuit components to a corresponding one of the mounting sections on a one-to-one correspondence basis by using solder, the outer electrodes of the circuit components which are set at the same potential are connected to the common land electrode. The bridge section is displaced toward one of sides of a direction perpendicular to the imaginary line (such a side may be hereinafter referred to as "the side on which the bridge section is displaced") which connects the centers of opposing mounting sections. With this configuration, even if a circuit component is misaligned, for example, toward an adjacent mounting section and is temporarily fixed, the amount by which the outer electrode of the circuit component overlaps the bridge section is smaller than that in the configuration of the related art even in a case in which the line width of the bridge section is formed at a sufficient width in order to prevent a break in the bridge section. The reason for this is that the bridge section is displaced toward one of the sides of a direction perpendicular to the imaginary line.

In the reflow process, one of the outer electrodes of each circuit component is connected to a corresponding one of the mounting sections on a one-to-one correspondence basis by using solder. During the reflow process, even if a circuit component is temporarily fixed with some misalignment, it moves back to a target mounting section due to the self-alignment phenomenon produced by the surface tension of a large amount of molten solder positioned on the target mounting section, thereby offsetting the misalignment. It is thus possible to provide a resin-sealed module having high resin-charging properties and including a circuit substrate on which a bridge section is not broken even if the size of a common land electrode is reduced in accordance with a smaller size of circuit components and on which a sufficient gap between plural circuit components mounted on the circuit substrate is reliably secured.

When a circuit component moves, for example, toward the side opposite to the side on which the bridge section is displaced, the amount by which the outer electrode of this circuit component overlaps the bridge section is minimal. Accordingly, the self-alignment phenomenon can be produced more efficiently, thereby making it possible to more efficiently suppress the occurrence of misalignment in the mounting positions of the circuit components.

At an edge of the bridge section on the side on which the bridge section is displaced, a protruding portion may be provided such that it protrudes from the area where the mounting sections are opposed to each other.

With this configuration, the line width of the bridge section can be formed even larger, thereby making it possible to decrease the parasitic inductance and the wiring resistance of the bridge section.

At an edge of the bridge section on a side opposite to the side on which the bridge section is displaced, a recessed portion may be formed such that it curves inward toward the side on which the bridge section is displaced.

With this configuration, when a circuit component moves, for example, toward the side opposite to the side on which the bridge section is displaced, the amount by which the outer electrode of this circuit component overlaps the bridge section is even smaller since a recessed portion is formed at the edge of the bridge section on the side opposite to the side on which the bridge section is displaced such that it curves inward toward the side on which the bridge section is displaced. Accordingly, the self-alignment phenomenon can be produced more efficiently, thereby making it possible to more efficiently suppress the occurrence of misalignment in the mounting positions of the circuit components.

The recessed portion may be formed in an arc shape.

Through meticulous examinations as to how the self-alignment phenomenon was produced when the shape of the bridge section was variously changed, the inventor of this application has found that the self-alignment phenomenon is produced most efficiently when the edge of the bridge section on the side opposite to the side on which the bridge section is displaced is formed in the shape of an arc which curves inward toward the side on which the bridge section is displaced. Accordingly, by forming the edge of the bridge section on the side opposite to the side on which it is displaced in the shape of an arc which curves inward toward the side on which the bridge section is displaced, the self-alignment phenomenon is produced effectively, thereby making it possible to more efficiently suppress the occurrence of misalignment in the mounting positions of the circuit components.

Additionally, if the bridge section (common land electrode) is formed by screen-printing using a conductive paste, the amount of print bleeding can be controlled more easily by forming the edge of the bridge section on the side opposite to the side on which the bridge section is displaced in the shape of an arc which curves inward toward the side on which the bridge section is displaced. As a result, the bridge section (common land electrode) can be formed with high precision, thereby making it possible to decrease a variation in the shape of the bridge sections.

The bridge section may be disposed between the circuit components connected to the mounting sections.

With this configuration, the bridge section which is displaced on one side of a direction perpendicular to the imaginary line is disposed between the circuit components connected to the mounting sections. Accordingly, on the first main surface of the circuit substrate, the space of the common land electrode and the space of the area where plural circuit components connected to this common land electrode are disposed can be saved. It is also possible to decrease the gap between a circuit component connected to a common land electrode and a circuit component connected to a land electrode disposed adjacent to this common land electrode. Thus, the integrity of components can be enhanced, and also, the size of the resin-sealed module can be decreased.

A line width of the bridge section may be formed smaller than a width of the area where the mounting sections are opposed to each other.

With this configuration, since the line width of the bridge section is formed smaller than the width of the area where mounting sections are opposed to each other, the amount of molten solder on the bridge section can be reduced. Accordingly, the amount of molten solder on the mounting section can be increased, thereby making it possible to more efficiently produce the self-alignment phenomenon.

The resin-sealed module may include two common land electrodes, each of which is the above-described common land electrode and is formed by linearly disposing the mounting sections. The resin-sealed module may also include a plurality of rectangular-parallelepiped chip components as the above-described plurality of circuit components. The outer electrode is formed at each end portion of each of the chip components. The mounting sections of one of the two common land electrodes and the associated mounting sections of the other common land electrode may be disposed in parallel with each other. The two common land electrodes may be disposed line-symmetrical with each other so that a distance between the mounting sections of the two common land electrodes disposed in parallel with each other will be equal to a distance between the outer electrodes of each of the chip components and so that a distance between the bridge sections of the common land electrodes will be different from the distance between the outer electrodes of each of the chip components. The chip components may be connected in parallel with each other by connecting one of the outer electrodes of each of the chip components to a corresponding one of the mounting sections of the common land electrodes disposed in parallel with each other and by connecting the other outer electrode of each of the chip components to the other corresponding one of the mounting sections of the common land electrodes disposed in parallel with each other.

With this configuration, as a plurality of circuit components, a plurality of rectangular-parallelepiped chip components having outer electrode formed at both end portions thereof are connected to the common land electrode. Two common land electrodes, each of which is formed by linearly disposing mounting sections, are arranged substantially in parallel with each other such that the mounting sections of one of the two common land electrodes and the associated mounting sections of the other common land electrode are disposed in parallel with each other. The two common land electrodes are arranged line-symmetrical with each other so that the distance between the mounting sections of the common land electrodes disposed in parallel will be equal to the distance between the outer electrodes formed at both end portions of each of the chip components and so that the distance between the bridge sections of the common land electrodes will be different from the distance between the outer electrodes of each of the chip components. Then, by connecting one of the outer electrodes of each of the chip components to a corresponding one of the mounting sections of the common land electrodes disposed in parallel and by connecting the other outer electrode of each of the chip components to the other corresponding one of the mounting sections of the common land electrodes disposed in parallel, the chip components are connected in parallel with each other.

(1) For example, if, among parallel-connected chip components, one chip component is misaligned in a direction toward an adjacent chip component by taking the shortest route and is temporarily fixed, the self-alignment phenomenon is produced in the following manner.

If one chip component is misaligned in a direction toward an adjacent chip component by taking the shortest route, since the distance between the bridge sections of the common land electrodes is different from that between the outer electrodes at both end portions of each chip component, the amount by which each of the outer electrodes of the misaligned chip component overlaps the corresponding bridge section is small. Accordingly, when the self-alignment phenomenon is produced in a state in which the chip component is misaligned in a manner described above, the outer electrodes of this chip component move back to the target mounting sections due to the surface tension of molten solder. Accordingly, even if a chip component is misaligned and temporarily fixed, as a result of the self-alignment phenomenon being produced appropriately, the gap between this chip component and the adjacent chip component can be reliably secured.

(2) For example, if, among parallel-connected chip components, one chip component is misaligned in a direction perpendicular to the direction in which this chip component can reach the adjacent chip component by taking the shortest route, and is then temporarily fixed, the self-alignment phenomenon is produced in the following manner.

When one chip component is misaligned in a direction perpendicular to the direction in which this chip component can reach the adjacent chip component by taking the shortest route, there is no land electrode (common land electrode) in the direction in which the outer electrodes at both end portions of this chip component have moved. Accordingly, when the self-alignment phenomenon is produced in a state in which one chip component is misaligned in a manner described above, the outer electrodes of this chip component move back toward the target mounting sections due to the surface tension of molten solder. Thus, even if a chip component is misaligned and temporarily fixed, as a result of the self-alignment phenomenon being produced appropriately, the gap between this chip component and the adjacent chip component can be reliably secured.

(3) For example, if, among parallel-connected chip components, one chip component is misaligned both in a direction toward an adjacent chip component by taking the shortest route and in a direction perpendicular to this direction and is temporarily fixed, the self-alignment phenomenon is produced in the following manner.

One chip component is misaligned both in a direction toward an adjacent chip component by taking the shortest route and in a direction perpendicular to this direction and is temporarily fixed. In this case, since the distance between the bridge sections of the common land electrodes is different from that between the outer electrodes at both end portions of each chip component, in accordance with the misalignment direction of this chip component, the amounts by which the outer electrodes overlap the bridge sections may be described as follows. In the common land electrode to which one of the outer electrodes at both end portions of this chip component is connected, if this outer electrode moves toward the side on which the bridge section is displaced, the amount by which this outer electrode overlaps the bridge section is increased. On the other hand, in the common land electrode to which the other outer electrode is connected, this outer electrode moves toward the side opposite to the side on which the bridge section is displaced, and thus, the amount by which this outer electrode overlaps the bridge section is relatively decreased. Conversely, in accordance with the misalignment direction of the chip component, the amounts by which the outer electrodes overlap the bridge sections may be described as follows. In the common land electrode to which one of the outer electrodes at both end portions of the chip component is connected, if this outer electrode moves toward the side opposite to the side on which the bridge section is displaced, the amount by which this outer electrode overlaps the bridge section is decreased. On the other hand, in the common land electrode to which the other outer electrode is connected, this outer electrode moves toward the side on which the bridge section is displaced, and thus, the amount by which this outer electrode overlaps the bridge section is relatively increased.

When the self-alignment phenomenon is produced in a state in which one chip component is misaligned in a manner described above, among the outer electrodes at both end portions of this chip component, the outer electrode which overlaps the bridge section by a smaller amount moves toward the target mounting section by a large distance due to the surface tension of molten solder. On the other hand, the outer electrode which overlaps the bridge section by a greater amount does not move considerably because of the surface tension of molten solder on the bridge section. Accordingly, as a result of the self-alignment phenomenon being produced appropriately, the outer electrode which overlaps the bridge section by a smaller amount is rotated about the outer electrode which overlaps the bridge section by a greater amount such that it moves toward the target mounting section. Thus, even if a chip component is misaligned and temporarily fixed, the gap between this chip component and the adjacent chip component can be reliably secured.

As described above, in whichever direction a chip component is misaligned and temporarily fixed, as a result of the self-alignment phenomenon being produced appropriately, at least one end portion of the chip component in the longitudinal direction moves to separate from the adjacent chip component. It is thus possible to prevent both end portions of one chip component from contacting those of the adjacent chip component. As a result, the gap between adjacent chip components can be reliably secured.

The resin-sealed module may include the common land electrode formed by interconnecting two of the mounting sections disposed side by side by using the bridge section, a first land electrode disposed in parallel with one of the mounting sections, a second land electrode disposed in parallel with the other mounting section, and two rectangular-parallelepiped chip components as the above-described plurality of circuit components. The outer electrode is formed at each end portion of each of the chip components. The two chip components may be connected in series with each other by connecting one of the outer electrodes of one of the chip components to one of the mounting sections and by connecting the other outer electrode to the first land electrode and by connecting one of the outer electrodes of the other chip component to the other mounting section and by connecting the other outer electrode to the second land electrode.

With this configuration, as a plurality of circuit components, two rectangular-parallelepiped chip components, each of which has an outer electrode at each end portion, are connected to a common land electrode. The common land electrode is formed by interconnecting two mounting sections disposed side by side by using a bridge section. The first land electrode is disposed in parallel with one of the mounting sections of the common land electrode, while the second land electrode is disposed in parallel with the other mounting section of the common land electrode. The two chip components are connected in series with each other by connecting one of the outer electrodes of one of the chip components to one of the mounting sections and by connecting the other outer electrode to the first land electrode and by connecting one of the outer electrodes of the other chip component to the other mounting section and by connecting the other outer electrode to the second land electrode.

The first and second land electrodes are disposed independently of and separately from each other. Accordingly, in whichever direction the chip components are misaligned and temporarily fixed, as a result of the self-alignment phenomenon being produced appropriately, the gap between the end portion at the outer electrode of one chip component connected to the first land electrode and the end portion at the outer electrode of the other chip component connected to the second land electrode can be reliably secured.

According to the present disclosure, a bridge section is disposed in an area where mounting sections are opposed to each other such that it is displaced toward a predetermined side. With this configuration, even if a circuit component is misaligned, for example, toward an adjacent mounting section and is temporarily fixed, the amount by which the outer electrode of this circuit component overlaps the bridge section is smaller than that in the configuration of the related art even in a case in which the line width of the bridge section is formed larger than that in the configuration of the related art. The reason for this is that the bridge section is displaced toward the predetermined side. Accordingly, the self-alignment phenomenon can be produced appropriately in the reflow process. It is thus possible to provide a resin-sealed module having high resin-charging properties and including a circuit substrate on which the bridge section is not broken even if the size of a common land electrode is reduced in accordance with a smaller size of a circuit component and on which a sufficient gap between plural circuit components mounted on the circuit substrate is reliably secured.

BRIEF DESCRIPTION OF THE SEVERAL VIEWS OF THE DRAWINGS

Each of FIGS. 1A and 1B illustrates a resin-sealed module according to an embodiment of the present disclosure.

FIGS. 3A through 3C show views illustrating different modes of the self-alignment phenomenon.

FIGS. 5A through 5C show views illustrating different modes of the self-alignment phenomenon.

FIGS. 6A, 6B and 6C show views for explaining experiments for evaluating the self-alignment phenomenon produced in the use of the common land electrodes shown in FIGS. 2 and 4 as examples: FIG. 6A is a view illustrating a state in which circuit components are connected in parallel with each other; FIG. 6B is a view in which circuit components are connected in series with each other; and FIG. 6C is a view illustrating a comparative example.

FIGS. 7A, 7B and 7C show views for explaining experiments for evaluating the self-alignment phenomenon produced in the use of the common land electrodes shown in FIGS. 2 and 4 as examples: FIG. 7A through FIG. 7C show views illustrating the amounts of misalignment when the circuit components are temporarily fixed.

FIG. 8 is a table for explaining experiments for evaluating the self-alignment phenomenon produced in the use of the common land electrodes shown in FIGS. 2 and 4 as examples and indicating inter-component gaps after the reflow process when there is no misalignment in the temporarily fixed circuit components.

FIG. 10A illustrates a state in which circuit components are connected in parallel with each other; and FIG. 10B illustrates a state in which circuit components are connected in series with each other.

FIG. 11A and FIG. 11B each illustrate a state in which circuit components are connected in series with each other.

FIG. 12A and FIG. 12B each illustrate a state in which circuit components are connected in parallel with each other.

DETAILED DESCRIPTION OF THE DISCLOSURE

A resin-sealed module according to an embodiment of the present disclosure will be described below.
(Schematic Configuration of Resin-sealed Module)

Figure 1A:
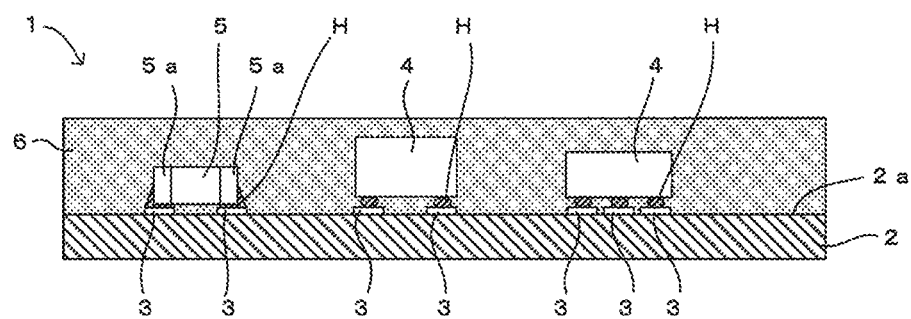
FIG. 1A is a sectional view of the resin-sealed module and FIG. 1B is a plan view of a circuit substrate.
Figure 1B:
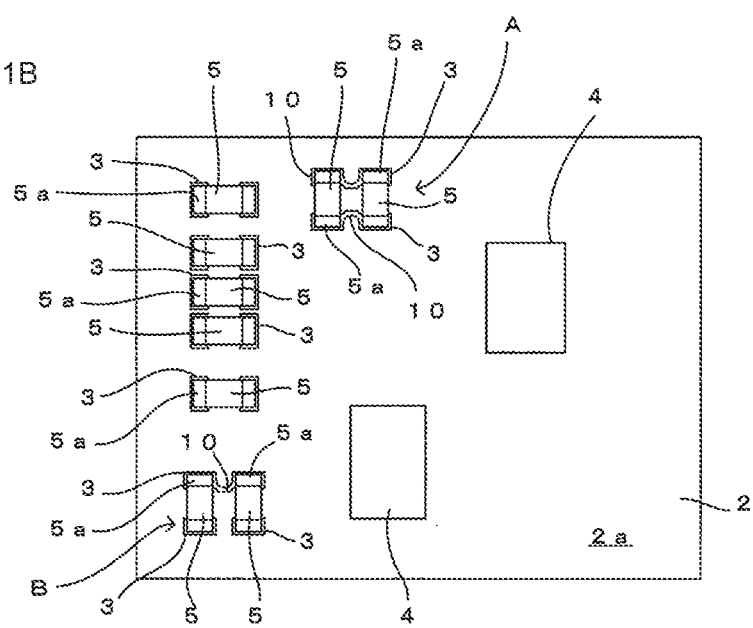

The schematic configuration of a resin-sealed module will be described below with reference to FIGS. 1A and 1B. Each of FIGS. 1A and 1B illustrates a resin-sealed module according to an embodiment of the present disclosure: FIG. 1A is a sectional view of the resin-sealed module and FIG. 1B) is a plan view of a circuit substrate.

In this embodiment, a resin-sealed module 1 shown in FIG. 1A includes a circuit substrate 2 made of resin or ceramic, various circuit components 4 and 5, and a resin sealing layer 6. The circuit components 4 and 5 are mounted on plural land electrodes 3 formed on a first main surface 2a of the circuit substrate 2. The resin sealing layer 6 is provided on the first main surface 2a of the circuit substrate 2 and is used for sealing the circuit components 4 and 5 therein. The resin-sealed module 1 may be used as various radio-frequency modules and power supply modules.

The circuit substrate 2 is constituted by a multilayer substrate, a multilayer resin substrate, or a general single substrate, which is suitably selected according to the purpose of use of the resin-sealed module 1. The multilayer substrate and the multilayer resin substrate are each constituted by a fired multilayer body formed of plural ceramic sheets on which predetermined wiring electrodes such as internal conductors and via-conductors are formed. According to the purpose of use of the resin-sealed module 1, the circuit substrate 2 within which components such as capacitors and inductors are integrated or in which capacitors and inductors are formed by using wiring electrodes within the substrate may be used.

The circuit components 4 are constituted by various functional components, such as RF-ICs and switch ICs. Each of the circuit components 4 is mounted on the first main surface 2a of the circuit substrate 2 by connecting outer electrodes of the circuit component 4 to land electrodes 3 by using solder H.

The circuit components 5 are constituted by chip components such as an inductor, a capacitor, and a resistor. Each of the circuit components 5 has a rectangular-parallelepiped component body and outer electrodes 5a formed at both end portions of the component body in the longitudinal direction. The circuit component 5 is mounted on the first main surface 2a of the circuit substrate 2 by connecting the outer electrodes 5a to land electrodes 3 by using solder H. The various circuit components 4 and 5 mounted on the first main surface 2a of the circuit substrate 2 form various circuits, such as matching circuits, required for forming the resin-sealed module 1.

The land electrodes 3 include common land electrodes 10. The outer electrodes 5a of some circuit components 5 are set at the same potential and are connected to a common land electrode 10. By connecting the outer electrodes 5a of some circuit components 5 set at the same potential to a common land electrode 10, plural circuit components 5 are connected in parallel with each other, as indicated by the region A in FIG. 1B, and plural circuit components 5 are connected in series with each other, as indicated by the region B in FIG. 1B.

The resin sealing layer 6 is formed of a typical molding resin, such as epoxy resin. The circuit components 4 and 5 mounted on the first main surface 2a of the circuit substrate 2 are sealed by using the resin sealing layer 6.

(Example of Parallel-connected Circuit Components Using Common Land Electrodes)

Figure 2:
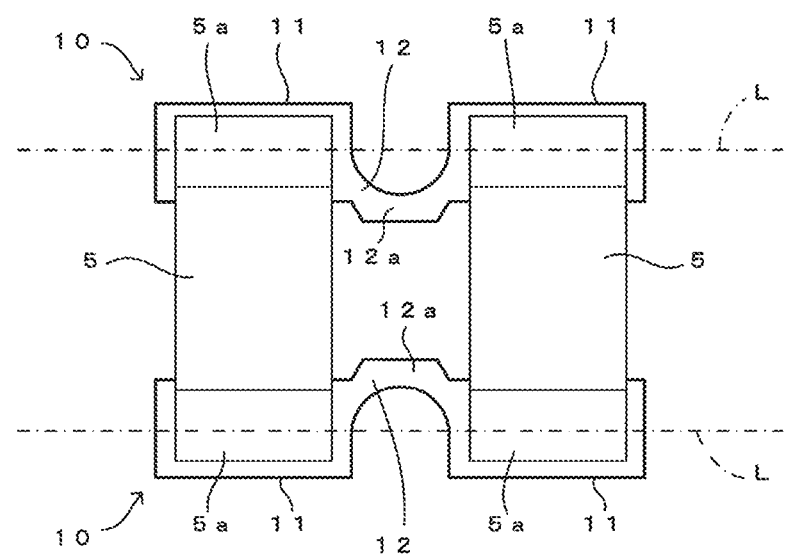
FIG. 2 is a view illustrating a state in which circuit components are connected in parallel with each other by using common land electrodes.
Figure 3A:
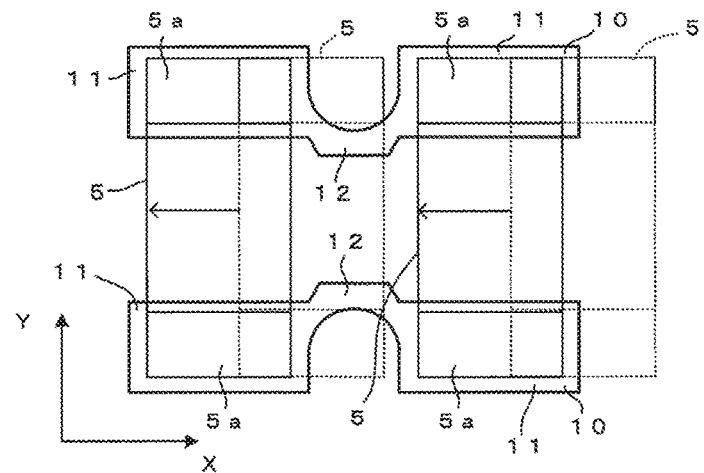
FIGS. 3A, 3B and 3C show views for explaining the self-alignment phenomenon produced in the parallel-connected circuit components shown in FIG. 2.
Figure 3B:
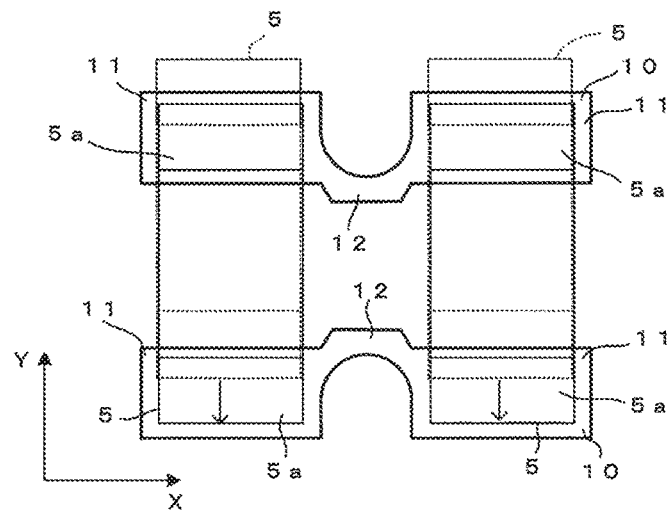
Figure 3C:
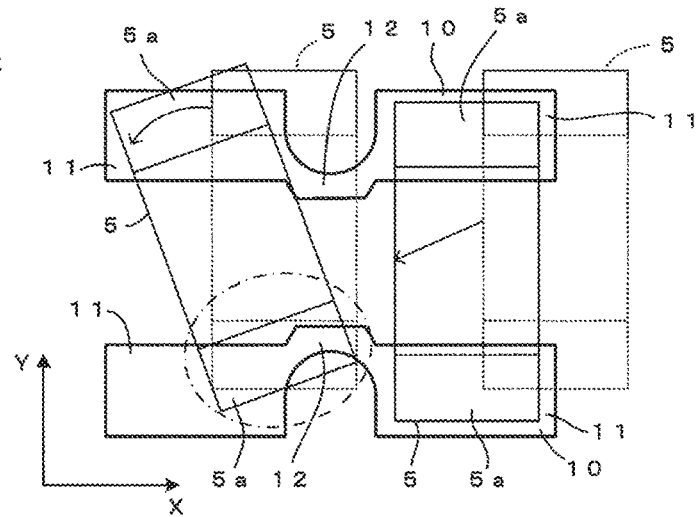

A detailed description will be given, with reference to FIGS. 2 and 3A, 3B and 3C, of an example in which two circuit components 5 are connected in parallel with each other by using common land electrodes 10 as indicated by the region A in FIG. 1B. FIG. 2 is a view illustrating a state in which circuit components are connected in parallel with each other by using common land electrodes. FIGS. 3A, 3B and 3C show views for explaining the self-alignment phenomenon produced in the parallel-connected circuit components shown in FIG. 2. FIGS. 3A through 3C show views illustrating different modes of the self-alignment phenomenon. In FIGS. 3A through 3C, the circuit components 5 indicated by the broken lines are those in a state in which they are misaligned and temporally fixed, and the circuit components 5 indicated by the solid lines are those in a state in which they move back after the reflow process due to the self-alignment phenomenon.

1. Common Land Electrode

The common land electrode 10 will be discussed below with reference to FIG. 2.

Each of the common land electrodes 10 includes two rectangular mounting sections 11 which are linearly disposed in the same direction and a bridge section 12 which is disposed in an area where the mounting sections 11 are opposed to each other so as to serve as a bridge interconnecting the mounting sections 11. One of the outer electrodes 5a of one circuit component 5 is connected to one mounting section 11 by using solder H, and one of the outer electrodes 5a of the other circuit component 5 is connected to the other mounting section 11 by using solder H. The bridge section 12 is displaced toward one of the sides of a direction perpendicular to a straight line L. The straight line L is an imaginary line indicated by the long dashed dotted line which connects the centers of opposing mounting sections 11. The straight line L corresponds to "an imaginary line which connects centers of mounting sections" in the disclosure of this application.

At the edge of the bridge section 12 on the side on which the bridge section 12 is displaced, a protruding portion 12a is provided such that it protrudes from the area where the mounting sections 11 are opposed to each other. At the edge of the bridge section 12 on the side opposite to the side on which the bridge section 12 is displaced, a recessed portion is formed such that it curves inward toward the side on which the bridge section 12 is displaced. The recessed portion is formed in the shape of an arc. In this embodiment, the line width of the bridge section 12 is formed smaller than the width of the area where the mounting sections 11 are opposed to each other. The width of the area where the mounting sections 11 are opposed to each other (the width of the mounting sections 11) may be set to be about 130 µm, for example, while the line width of the bridge section 12 may be set to be about 80 µm, for example. In order to prevent the occurrence of a break in the bridge section 12, the line width of the bridge section 12 is desirably set to be about 40 to 50 µm or greater.

2. Arrangement State of Common Land Electrodes and Circuit Components

The arrangement state of the common land electrodes 10 and the circuit components 5 will be described below with reference to FIG. 2.

In the example shown in FIG. 2, the two common land electrodes 10 are arranged in the following manner. The two common land electrodes 10 are arranged substantially in parallel with each other such that each of the mounting sections 11 of one common land electrode 10 and an associated mounting section 11 of the other common land electrode 10 are disposed in parallel. The two common land electrodes 10 are arranged line-symmetrical with each other so that the distance between the mounting sections 11 of the common land electrodes 10 disposed in parallel will be substantially equal to the distance between the outer electrodes 5a formed at both end portions of each of the circuit components 5 and so that the distance between the bridge sections 12 of the common land electrodes 10 will be different from the distance between the outer electrodes 5a of each of the circuit components 5.

Then, by connecting one of the outer electrodes 5a of each of the circuit components 5 to one of the mounting sections 11 of the common land electrodes 10 disposed in parallel and by connecting the other outer electrode 5a of each of the circuit components 5 to the other one of the mounting sections 11 of the common land electrodes 10 disposed in parallel, the circuit components 5 are connected in parallel with each other. In the example shown in FIG. 2, the common land electrodes 10 are arranged such that each of the bridge sections 12 is disposed between the circuit components 5 connected to the mounting sections 11.

3. Self-Alignment Phenomenon

The self-alignment phenomenon produced in the example shown in FIG. 2 will be discussed below with reference to FIGS. 3A, 3B and 3C. The misalignment directions and the misalignment amounts of the circuit components 4 and 5 misaligned when being mounted at predetermined positions on the first main surface 2a of the circuit substrate 2 by using a component mounter are substantially the same, and an explanation thereof will be omitted in the following description.

(1) If the circuit components 5 to be connected in parallel with each other are misaligned in the direction indicated by the arrow X and are temporarily fixed, as indicated by the broken lines in FIG. 3A, the self-alignment phenomenon is produced in the following manner. The direction indicated by the arrow X is the direction of the straight line L shown in FIG. 2, and the direction indicated by the arrow Y is a direction perpendicular to the straight line L.

The circuit component 5 disposed on the left side in FIG. 3A is misaligned in a direction toward the adjacent (right side) circuit component 5 by taking the shortest route and is temporarily fixed, as indicated by the broken lines in FIG. 3A. In this case, since the distance between the bridge sections 12 of the common land electrodes 10 is different from that between the outer electrodes 5a at both end portions of the circuit component 5, the amount by which each of the outer electrodes 5a overlaps the corresponding bridge section 12 is small. Accordingly, when the self-alignment phenomenon is produced, the outer electrodes 5a of the circuit component 5 move back toward the target mounting sections 11 on the left side due to the surface tension of molten solder, as shown in FIG. 3A.

The circuit component 5 disposed on the right side in FIG. 3A is misaligned in a direction in which it extends toward the outside of the land electrodes 10 and is temporarily fixed, as indicated by the broken lines in FIG. 3A. Accordingly, when the self-alignment phenomenon is produced, the outer electrodes 5a of the circuit component 5 move back toward the target mounting sections 11 on the right side due to the surface tension of molten solder, as shown in FIG. 3A.

Accordingly, even if the circuit components 5 are misaligned and temporarily fixed, as a result of the self-alignment phenomenon being produced appropriately, the gap between the circuit components 5 can be reliably secured.

(2) If the circuit components 5 to be connected in parallel with each other are misaligned in the direction indicated by the arrow Y and are temporarily fixed, as indicated by the broken lines in FIG. 3B, the self-alignment phenomenon is produced in the following manner.

The circuit components 5 are misaligned in a direction in which they extend toward the outside of the land electrodes 10 and are temporarily fixed, as indicated by the broken lines in FIG. 3B. Accordingly, when the self-alignment phenomenon is produced, the outer electrodes 5a of the circuit components 5 move back toward the target mounting sections 11 due to the surface tension of molten solder. Thus, even if the circuit components 5 are misaligned and temporarily fixed, as a result of the self-alignment phenomenon being produced appropriately, the gap between the circuit components 5 can be reliably secured.

(3) If the circuit components 5 to be connected in parallel with each other are misaligned both in the direction indicated by the arrow X and in the direction indicated by the arrow Y and are temporarily fixed, as indicated by the broken lines in FIG. 3C, the self-alignment phenomenon is produced in the following manner.

The circuit component 5 disposed on the left side in FIG. 3C is misaligned both in a direction toward the adjacent (right side) circuit component 5 by taking the shortest route and in a direction perpendicular to this direction and is temporarily fixed, as indicated by the broken lines in FIG. 3C. The distance between the bridge sections 12 of the common land electrodes 10 is different from that between the outer electrodes 5a of the circuit component 5. Thus, in accordance with the misalignment direction of the circuit component 5, the amounts by which the outer electrodes 5a overlap the bridge sections 12 may be described as follows. In the common land electrode 10 to which one of the outer electrodes 5a at both end portions of the circuit component 5 is connected, if this outer electrode 5a moves toward the side on which the bridge section 12 is displaced, the amount by which this outer electrode 5a overlaps the bridge section 12 is increased. On the other hand, in the common land electrode 10 to which the other outer electrode 5a is connected, this outer electrode 5a moves toward the side opposite to the side on which the bridge section 12 is displaced, and thus, the amount by which this outer electrode 5a overlaps the bridge section 12 is relatively decreased.

Conversely, in accordance with the misalignment direction of the circuit component 5, the amounts by which the outer electrodes 5a overlap the bridge sections 12 may be described as follows. In the common land electrode 10 to which one of the outer electrodes 5a at both end portions of the circuit component 5 is connected, if this outer electrode 5a moves toward the side opposite to the side on which the bridge section 12 is displaced, the amount by which this outer electrode 5a overlaps the bridge section 12 is decreased. On the other hand, in the common land electrode 10 to which the other outer electrode 5a is connected, this outer electrode 5a moves toward the side on which the bridge section 12 is displaced, and thus, the amount by which this outer electrode 5a overlaps the bridge section 12 is relatively increased.

Accordingly, when the self-alignment phenomenon is produced, among the outer electrodes 5a at both end portions of the circuit component 5, the outer electrode 5a which overlaps the bridge section 12 by a smaller amount moves toward the target mounting section 11 on the left side by a large distance due to the surface tension of molten solder. On the other hand, as indicated by the region surrounded by the long dashed dotted line in FIG. 3C, the outer electrode 5a which overlaps the bridge section 12 by a greater amount does not move considerably because of the surface tension of molten solder on the bridge section 12. Accordingly, even if the circuit component 5 on the left side is misaligned and temporarily fixed, as a result of the self-alignment phenomenon being produced appropriately, the outer electrode 5a which overlaps the bridge section 12 by a smaller amount is rotated about the outer electrode 5a which overlaps the bridge section 12 by a greater amount such that it moves toward the target mounting section 11 on the left side.

The circuit component 5 disposed on the right side in FIG. 3C is misaligned in a direction in which it extends toward the outside of the common land electrodes 10 and is temporarily fixed, as indicated by the broken lines in FIG. 3C. Accordingly, when the self-alignment phenomenon is produced, the outer electrodes 5a of the circuit component 5 move toward the target mounting sections 11 on the right side due to the surface tension of molten solder, as shown in FIG. 3C.

Accordingly, even if the circuit components 5 are misaligned and temporarily fixed, as a result of the self-alignment phenomenon being produced appropriately, the gap between the circuit components 5 can be reliably secured.

As described above, in whichever direction a circuit component 5 is misaligned and temporarily fixed, as a result of the self-alignment phenomenon being produced appropriately, at least one end portion of the circuit component 5 in the longitudinal direction moves to separate from an adjacent circuit component 5. It is thus possible to prevent both end portions of one circuit component 5 from contacting those of the adjacent circuit component 5. As a result, the gap between the adjacent circuit components 5 can be reliably secured.

In the examples discussed with reference to FIGS. 2 and 3A, 3B and 3C, the common land electrode 10 is constituted by two mounting sections 11 arranged side by side and interconnected by the bridge section 12. However, by using two common land electrodes each constituted by three or more mounting sections 11 which are linearly arranged side by side, three or more circuit components 5 may be connected in parallel with each other.

(Example of Series-connected Circuit Components Using Common Land Electrode)

Figure 4:
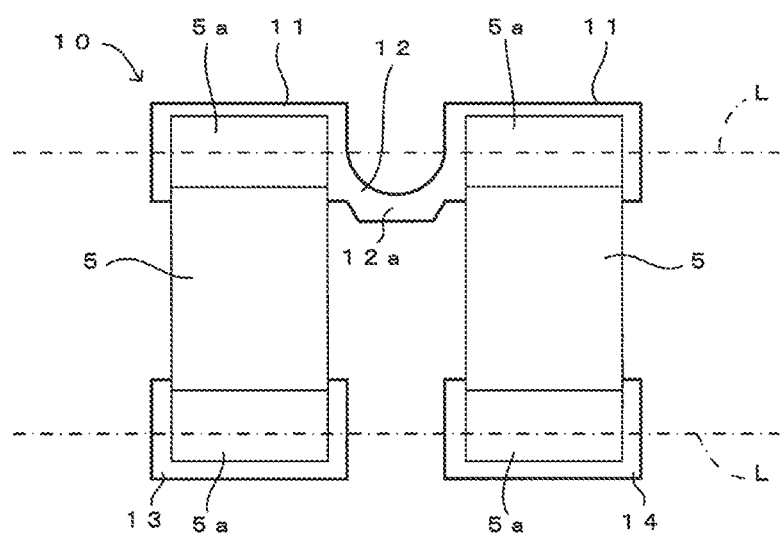
FIG. 4 is a view illustrating a state in which circuit components are connected in series with each other by using a common land electrode.
Figure 5A:
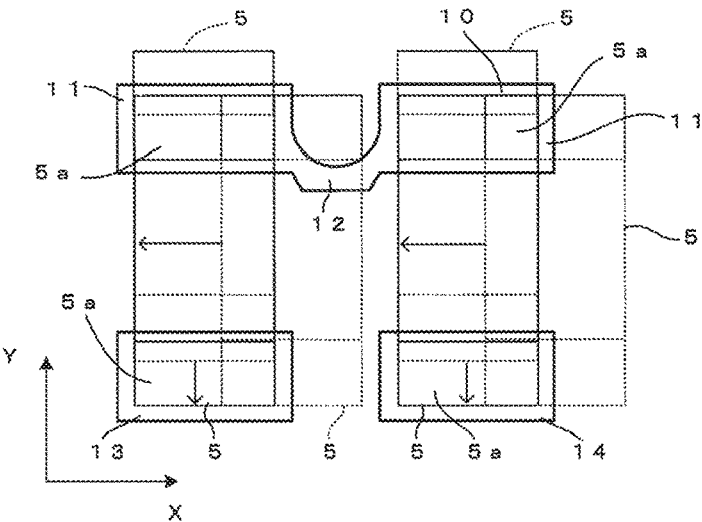
FIGS. 5A, 5B and 5C show views for explaining the self-alignment phenomenon produced in the series-connected circuit components shown in FIG. 4.
Figure 5B:
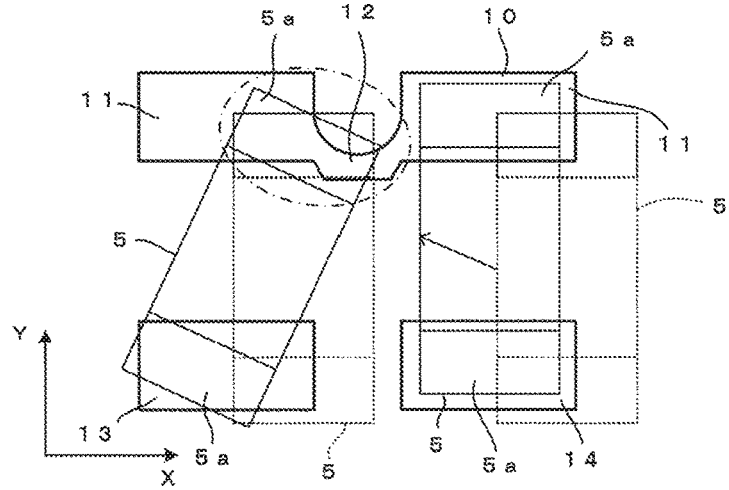
Figure 5C:
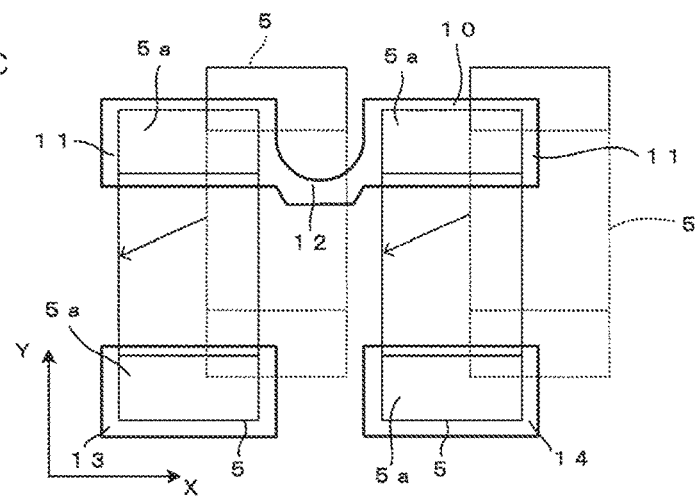

A detailed description will be given, with reference to FIGS. 4 and 5A, 5B and 5C, of an example in which two circuit components 5 are connected in series with each other by using a common land electrode 10 and first and second land electrodes 13 and 14 as indicated by the region B in FIG. 1B. FIG. 4 is a view illustrating a state in which circuit components are connected in series with each other by using a common land electrode. FIGS. 5A, 5B and 5C show views for explaining the self-alignment phenomenon produced in the series-connected circuit components shown in FIG. 4. FIGS. 5A through 5C show views illustrating different modes of the self-alignment phenomenon. In FIGS. 5A through 5C, the circuit components 5 indicated by the broken lines are those in a state in which they are misaligned and tempoarally fixed, and the circuit components 5 indicated by the solid lines are those in a state in which they have moved back after the reflow process due to the self-alignment phenomenon. Configurations similar to those described above are designated by like reference numerals, and an explanation thereof will thus be omitted.

1. Arrangement State of Common Land Electrode and Circuit Components

The arrangement state of the common land electrode 10 and the circuit components 5 will be described below with reference to FIG. 4.

The common land electrode 10 is constituted by two mounting sections 11 arranged side by side and interconnected by a bridge section 12. The first and second land electrodes 13 and 14 are provided as the land electrodes 3. In the example shown in FIG. 4, the common land electrode 10 and the first and second land electrodes 13 and 14 are arranged in the following manner. The first land electrode 13 is provided in parallel with one of the mounting sections 11 of the common land electrode 10, while the second land electrode 14 is provided in parallel with the other mounting section 11. One outer electrode 5a of one of the circuit components 5 is connected to one of the mounting sections 11 of the common land electrode 10, while the other outer electrode 5a is connected to the first land electrode 13. One outer electrode 5a of the other circuit component 5 is connected to the other mounting section 11 of the common land electrode 10, while the other outer electrode 5a is connected to the second land electrode 14. With this configuration, the circuit components 5 are connected in series with each other. In the example shown in FIG. 4, the common land electrode 10 is arranged such that the bridge section 12 is disposed between the circuit components 5 connected to the mounting sections 11.

2. Self-Alignment Phenomenon

The self-alignment phenomenon produced in the example shown in FIG. 4 will be discussed below with reference to FIGS. 5A, 5B and 5C.

(1) In the example shown in FIG. 4, the first and second land electrodes 13 and 14 are disposed independently of and separately from each other. Accordingly, as shown in FIG. 5A through FIG. 5C, in whichever direction the circuit components 5 are misaligned and temporarily fixed, when the self-alignment phenomenon is produced, the end portion at the outer electrode 5a of one circuit component 5 connected to the first land electrode 13 moves toward the first land electrode 13, while the end portion at the outer electrode 5a of the other circuit component 5 connected to the second land electrode 14 moves toward the second land electrode 14. It is thus possible to reliably secure a gap between the end portion at the outer electrode 5a of one circuit component 5 connected to the first land electrode 13 and the end portion at the outer electrode 5a of the other circuit component 5 connected to the second land electrode 14.

(2) As indicated by the broken lines in FIG. 5A, when the circuit component 5 on the left side is misaligned in a direction toward the adjacent (right side) circuit component 5 by taking the shortest route and is temporarily fixed, the amount by which the outer electrode 5a at the upper end of the circuit component 5 overlaps the bridge section 12 of the common land electrode 10 is small, as in the circuit component 5 discussed with reference to FIG. 3A. Accordingly, when the self-alignment phenomenon is produced, due to the surface tension of molten solder, one of the outer electrode 5a of the circuit component 5 on the left side moves back toward the target mounting section 11 on the left side and the other outer electrode 5a moves back toward the first land electrode 13, as shown in FIG. 5A.

As indicated by the broken lines in FIGS. 5A through 5C, if the circuit components 5 are misaligned in the direction indicated by the arrow Y or if a circuit component 5 is misaligned in a direction in which it is separated from the adjacent circuit component 5, when the self-alignment phenomenon is produced, the circuit components 5 move back to the target design mounting positions, in a manner similar to that discussed with reference to FIG. 3A through FIG. 3C.

(3) As indicated by the broken lines in FIG. 5B, if the end portion of the circuit component 5 connected to the common land electrode 10 moves toward the side on which the bridge section 12 is displaced, the amount by which the outer electrode 5a overlaps the bridge section 12 is increased. In this case, as in the circuit component 5 discussed with reference to FIG. 3C, when the self-alignment phenomenon is produced, the outer electrode 5a located on the opposite side is rotated about the outer electrode 5a which overlaps the bridge section 12 by a greater amount indicated by the portion surrounded by the long dashed dotted line such that it moves toward the first land electrode 13, which is the target mounting position.

(4) As indicated by the broken lines in FIG. 5C, if the end portion of the circuit component 5 connected to the common land electrode 10 moves toward the side opposite to the side on which the bridge section 12 is displaced, the amount by which the outer electrode 5a overlaps the bridge section 12 is decreased. In this case, as in the circuit component 5 discussed with reference to FIG. 3A and FIG. 5A, when the self-alignment phenomenon is produced, this outer electrode 5a moves toward the target mounting section 11 on the left side.

(Evaluations)

A description will be given, with reference to FIGS. 6A through 9, of the results of experiments conducted for evaluating the self-alignment phenomenon produced in the use of the common land electrodes shown in FIGS. 2 and 4 as examples.

Figure 9:
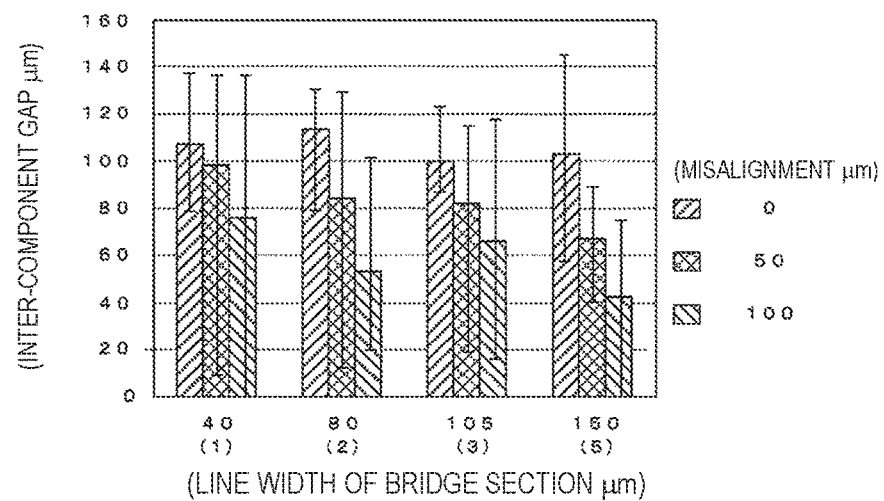
FIG. 9 is a diagram illustrating the results of experiments discussed with reference to FIGS. 6A through 8.

FIGS. 6A through 8 show views and a table for explaining the self-alignment phenomenon produced in the use of the common land electrodes shown in FIGS. 2 and 4 as examples. FIG. 6A is a view illustrating a state in which circuit components are connected in parallel with each other. FIG. 6B is a view in which circuit components are connected in series with each other. FIG. 6C is a view illustrating a comparative example. FIG. 7A through FIG. 7C show views illustrating the amounts of misalignment when the circuit components are temporarily fixed. FIG. 8 is a table indicating inter-component gaps after the reflow process when there is no misalignment in the temporarily fixed circuit components. FIG. 9 is a diagram illustrating the results of experiments discussed with reference to FIGS. 6 through 8.

1. Experiment Method

As shown in FIG. 8, four examples (1) through (4) and one comparative example (5) are provided. The items shown in FIG. 8 will be explained below.

Design Gap:

The design gap is the design gap a between the circuit components 5, as shown in FIG. 6A.

Common Land Electrode:

"Both sides" indicated in examples (1) through (3) and comparative example (5) represents that two common land electrodes 10 are disposed in parallel and that two common land electrodes 10a are disposed in parallel so that circuit components 5 are connected in parallel with each other, as shown in FIG. 6A and FIG. 6C. The configurations of examples (1) through (3) are similar to the configuration of the example discussed with reference to FIG. 2. "One side" indicated in example (4) represents that one common land electrode 10 is disposed so that circuit components 5 are connected in series with each other, as shown in FIG. 6B. The configuration of example (4) is similar to that of the example discussed with reference to FIG. 4.

Line Width of Bridge Section:

The line width of the bridge section is the line width β of the bridge sections 12 and 12b of the common land electrodes 10 and 10a, respectively, as shown in FIG. 6A. In comparative example (5), the line width β of the bridge section 12b is set to be equal to the width of the mounting section 11a.

Average Gap

The average gap indicates the average value of the measured values obtained by repeatedly measuring the inter-component gap after the reflow process when the circuit components 5 were temporarily fixed without any misalignment as shown in FIG. 7A, in examples (1) through (4) and comparative example (5).

Minimum Gap

The minimum gap indicates the minimum value of the measured values obtained by repeatedly measuring the inter-component gap after the reflow process when the circuit components 5 were temporarily fixed without any misalignment as shown in FIG. 7A, in examples (1) through (4) and comparative example (5).

3σ

3σ represents a sample statistic based on the standard deviation σ of the measured values obtained by repeatedly measuring the inter-component gap after the reflow process when the circuit components 5 were temporarily fixed without any misalignment as shown in FIG. 7A, in examples (1) through (4) and comparative example (5). That is, 3σ represents a sample statistic indicating that the measured values obtained by measuring the inter-component gap are contained within a range "average gap±3σ" with a probability of 99.7%.

Average−3σ

"Average−3σ" represents the "average gap−3σ". By using this index, it is possible to estimate to which degree the inter-component gap after the reflow process will be reduced.

The experiment method will be discussed below with reference to FIGS. 7A, 7B and 7C.

Measurements with Misalignment of 0 μm

In examples (1) through (4) and comparative example (5), the inter-component gap after the reflow process when the circuit components 5 were temporarily fixed without any misalignment as shown in FIG. 7A was repeatedly measured.

Measurements with Misalignment of 50 μm

In examples (1) through (3) and comparative example (5), the inter-component gap after the reflow process when the circuit components 5 were temporarily fixed in a state in which the solder H and the circuit components 5 were misaligned by 50 μm both in the directions indicated by the arrow X and the arrow Y as shown in FIG. 7B was repeatedly measured.

Measurements with Misalignment of 100 μm

In examples (1) through (3) and comparative example (5), the inter-component gap after the reflow process when the solder H was disposed in a state in which it was misaligned by 50 μm both in the directions indicated by the arrow X and the arrow Y and the circuit components 5 were temporarily fixed in a state in which they were misaligned by 100 μm both in the directions indicated by the arrow X and the arrow Y as shown in FIG. 7C was repeatedly measured. The measurement conditions are as follows. The circuit components 5 were temporarily fixed on nine portions of a substrate in a state in which they were misaligned by a predetermined amount, and then, a reflow process with a temperature profile similar to that in a mass-production process was conducted. Then, the inter-component gap was measured. By considering this operation as one flow, the flow was repeated four times. As a result, for each condition concerning the amount of misalignment (each of the amounts of misalignment of 0 μm, 50 μm, and 100 μm), thirty-six items of data (nine portions × four times of the flow) were obtained.

2. Experiment Results (1) Examinations when Circuit Components 5 were Temporarily Fixed without any Misalignment In each of examples (1) through (4) and comparative example (5), the average value of the inter-component gap after the reflow process when the circuit components 5 were temporarily fixed without any misalignment as shown in FIG. 7A is maintained at a sufficient size with respect to the design gap (125 µm). On the other hand, however, the value of "average−3σ" in comparative example (5) is extremely small. Accordingly, in comparative example (5), it is possible that the inter-component gap after the reflow process may be considerably reduced. In contrast, in examples (1) through (4), a sufficient inter-component gap after the reflow process can be reliably secured.

(2) Examinations when Circuit Components 5 were Temporarily Fixed with Some Misalignment As shown in FIG. 9, in a case in which the circuit components 5 were temporarily fixed with some misalignment, the inter-component gap after the reflow process in examples (1) through (3) can be reliably secured, in comparison with that in comparative example (5). Concerning examples (1) through (3), as the line width β of the bridge section 12 is smaller, the inter-component gap after the reflow process can be secured more reliably.

As described above, according to this embodiment, the common land electrode 10 formed on the first main surface 2a of the circuit substrate 2 includes plural mounting sections 11 arranged side by side and a bridge section 12. The bridge section 12 is disposed in an area where mounting sections 11 are opposed to each other so as to serve as a bridge interconnecting the mounting sections 11. By connecting one of outer electrodes 5a of each of plural circuit components 5 to a corresponding one of the mounting sections 11 on a one-to-one correspondence basis by using solder H, the outer electrodes 5a of the plural circuit components 5 which are set at the same potential are connected to the common land electrode 10.

The bridge section 12 is displaced toward one of the sides of a direction perpendicular to an imaginary line (perpendicular to the direction of the straight line L) which connects the centers of opposing mounting sections 11. With this configuration, even if a circuit component 5 is misaligned, for example, toward an adjacent mounting section 11 and is temporarily fixed, the amount by which the outer electrode 5a of the circuit component 5 overlaps the bridge section 12 is smaller than that in the configuration of the related art even in a case in which the line width β of the bridge section 12 is formed at a sufficient width in order to prevent a break in the bridge section 12. The reason for this is that the bridge section 12 is displaced toward one of the sides of a direction perpendicular to the imaginary line.

In the reflow process, one of the outer electrodes 5a of each circuit component 5 is connected to a corresponding one of the mounting sections 11 on a one-to-one correspondence basis by using solder H. During the reflow process, even if a circuit component 5 is temporarily fixed with some misalignment, it moves toward a target mounting section 11 due to the self-alignment phenomenon produced by the surface tension of a large amount of molten solder positioned on the target mounting section 11, thereby offsetting the misalignment. It is thus possible to provide a resin-sealed module 1 having high component mountability, cleaning properties, solder-splash resistance, and resin-charging properties and including a circuit substrate 2 on which a bridge section 12 is not broken even if the size of a common land electrode 10 is reduced in accordance with a smaller size of circuit components 5 and on which a sufficient gap between plural circuit components 5 mounted on the circuit substrate 2 is reliably secured.

At the edge of the bridge section 12 on the side on which it is displaced, the protruding portion 12a is provided such that it protrudes from the area where mounting sections 11 are opposed to each other. Accordingly, the line width β of the bridge section 12 can be formed even larger, thereby making it possible to decrease the parasitic inductance and the wiring resistance of the bridge section 12.

The edge of the bridge section 12 on the side opposite to the side on which it is displaced is formed in the shape of an arc which curves inward toward the side on which the bridge section 12 is displaced. This makes it possible to effectively produce the self-alignment phenomenon and thus to more efficiently suppress the occurrence of misalignment in the mounting positions of the circuit components 5. Additionally, if the bridge section 12 (common land electrode 10) is formed by screen-printing using a conductive paste, the amount of print bleeding can be controlled more easily by forming the edge of the bridge section 12 on the side opposite to the side on which the bridge section 12 is displaced in the shape of an arc which curves inward toward the side on which the bridge section 12 is displaced. As a result, the bridge section 12 (common land electrode 10) can be formed with high precision, thereby making it possible to decrease a variation in the shape of the bridge sections 12.

The bridge section 12 which is displaced on one side of a direction perpendicular to the imaginary line is disposed between circuit components 5 connected to the mounting sections 11. Accordingly, on the first main surface 2a of the circuit substrate 2, the space of the common land electrode 10 and the space of the area where plural circuit components 5 connected to this common land electrode 10 are disposed can be saved. It is also possible to decrease the gap between a circuit component 5 connected to a common land electrode 10 and a circuit component 4 or 5 connected to a land electrode 3 disposed adjacent to this common land electrode 10. Thus, the integrity of components can be enhanced, and also, the size of the resin-sealed module 1 can be decreased.

Since the line width β of the bridge section 12 is formed smaller than the width of the area where mounting sections 11 are opposed to each other, the amount of molten solder on the bridge section 12 can be reduced. Accordingly, the amount of molten solder on the mounting section 11 can be increased, thereby making it possible to more efficiently produce the self-alignment phenomenon.

MODIFIED EXAMPLES

Modified examples of common land electrodes will be described below with reference to FIGS. 10A through 12B. In the following description, points different from the above-described embodiment will mainly be discussed, and the configurations similar to those of the embodiment are designated by like reference numerals, and an explanation thereof will be omitted.

1. First Modified Example

Figure 10A:
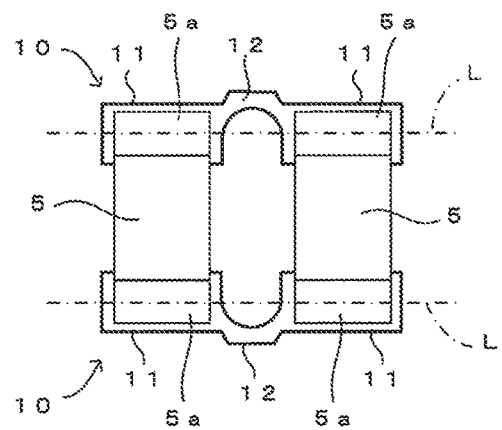
FIGS. 10A and 10B show views illustrating a first modified example of common land electrodes.
Figure 10B:
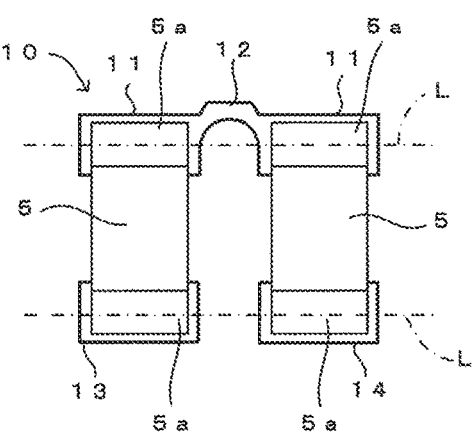

A first modified example will be described below with reference to FIGS. 10A and 10B. FIGS. 10A and 10B show views of the first modified example of common land electrodes. FIG. 10A illustrates a state in which circuit components are connected in parallel with each other, and FIG. 10B illustrates a state in which circuit components are connected in series with each other. In the first modified example, the common land electrodes 10 are arranged such that the bridge sections 12 of the common land electrodes 10 are disposed on the outer side of the area between circuit components 5 connected to the common land electrodes 10.

2. Second Modified Example

Figure 11A:
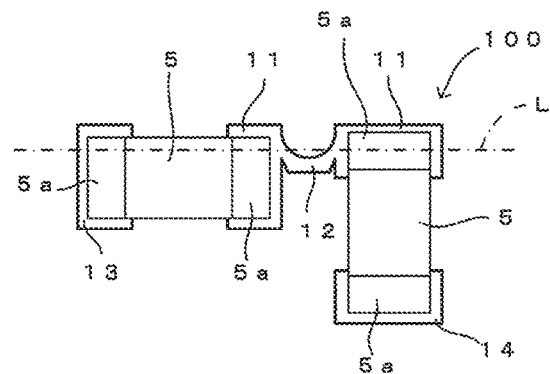
FIGS. 11A and 11B show views illustrating a second modified example of common land electrodes.
Figure 11B:
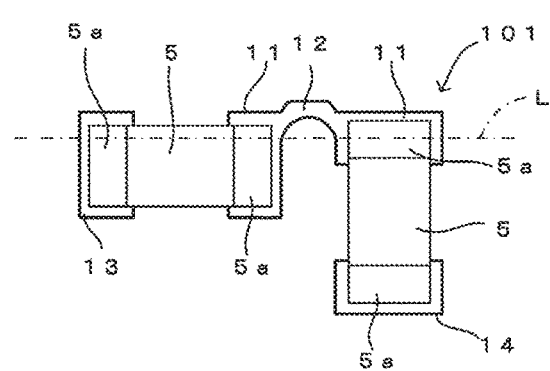

A second modified example will be described below with reference to FIGS. 11A and 11B. FIGS. 11A and 11B show views of the second modified example of common land electrodes. FIG. 11A and FIG. 11B each illustrate a state in which circuit components are connected in series with each other. In the second modified example, rectangular mounting sections 11 forming a common land electrode 100 and those forming a common land electrode 101 are arranged side by side by changing the orientation of one of the mounting sections 11 (such that the longitudinal directions of the mounting sections 11 are substantially perpendicular to each other). Then, in a manner similar to the above-described embodiment, the mounting sections 11 are interconnected by a bridge section 12 which is displaced in one of the sides of a direction perpendicular to a straight line (imaginary line) L which connects the centers of opposing mounting sections 11. The common land electrodes 100 and 101 are formed in this manner. In the modified example shown in FIG. 11A, the common land electrode 100 is formed such that the bridge section 12 is disposed between the circuit components 5. In the modified example shown in FIG. 11B, the common land electrode 101 is formed such that the bridge section 12 is disposed on the outer side of the area between the circuit components 5.

3. Third Modified Example

Figure 12A:
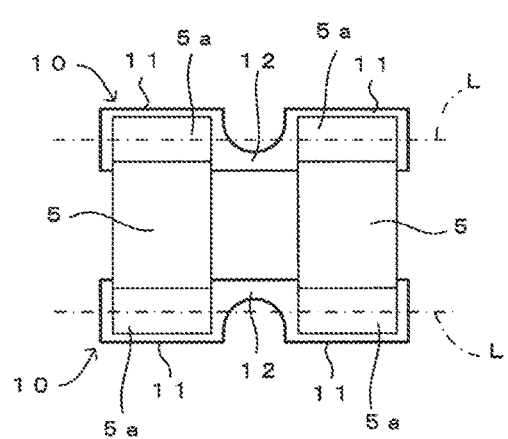
FIGS. 12A and 12B show views of a third modified example of common land electrodes.
Figure 12B:
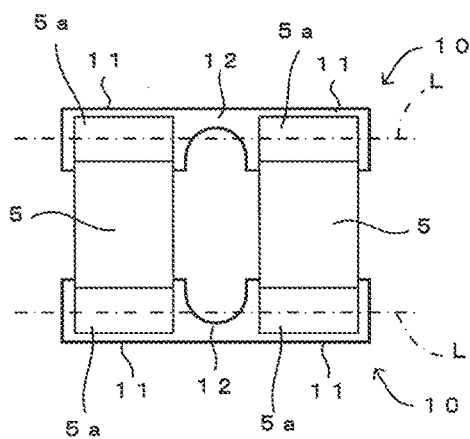

A third modified example will be described below with reference to FIGS. 12A and 12B. FIGS. 12A and 12B show views of the third modified example of common land electrodes. FIG. 12A and FIG. 12B each illustrate a state in which circuit components are connected in parallel with each other. In the third modified example, the bridge section 12 is not provided with a protruding portion 12a. In the modified example shown in FIG. 12A, the bridge sections 12 are disposed on the inner sides of the common land electrodes 10 arranged in parallel with each other. In the modified example shown in FIG. 12B, the bridge sections 12 are disposed on the outer sides of the common land electrodes 10 arranged in parallel with each other.

Reference Example

Figure 13:
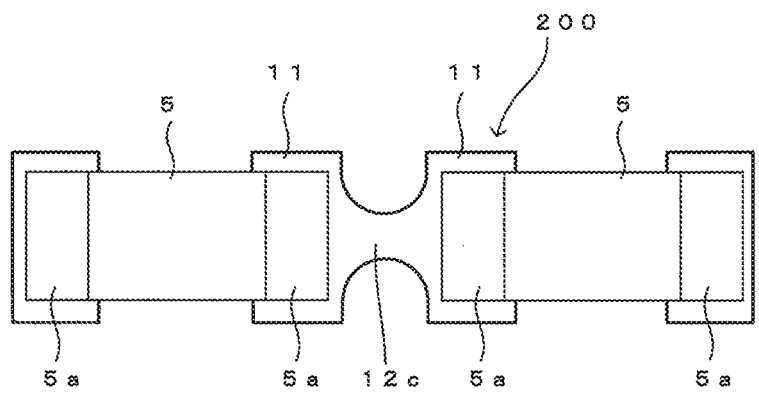
FIG. 13 is a view illustrating a reference example of a common land electrode.
Figure 14:
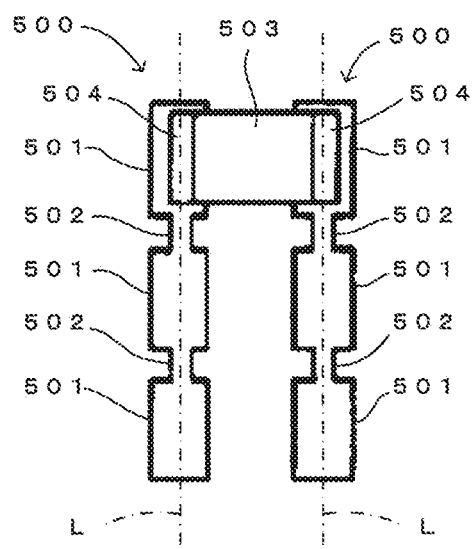
FIG. 14 is a plan view illustrating a known common land electrode.

A reference example of a common land electrode will be described below with reference to FIG. 13. FIG. 13 is a view illustrating the reference example of a common land electrode. In the following description, points different from the above-described embodiment will mainly be discussed, and the configurations similar to those of the embodiment are designated by like reference numerals, and an explanation thereof will be omitted. In a common land electrode 200 of the reference example shown in FIG. 13, a bridge section 12c is positioned on the straight line L where the distance between mounting sections 11 is minimized, as in the configuration of the related art discussed with reference to FIG. 14. However, both of the upper edge and the lower edge of the bridge section 12c are formed in the shape of an arc. With this configuration, the self-alignment phenomenon can be produced more effectively than in the configuration of the related art.

The present disclosure is not restricted to the above-described embodiment. Various modifications may be made to the embodiment without departing from the spirit of the disclosure, and the configurations in the embodiment may be combined in any desired manner. For example, the shape of the mounting section 11 is not restricted to a rectangle and may be formed in any shape, such as a circle and an ellipse. The shape of the bridge section 12 is not restricted to the above-described shapes as long as the bridge section 12 can be disposed on one side of a direction perpendicular to the straight line L. The bridge section 12 may be formed in the shape of an arc and be disposed such that the arc portion protrudes from an area where mounting sections 11 are opposed to each other. A common land electrode may be formed by interconnecting three or more mounting sections 11 arranged side by side by bridge sections 12.

In the above-described embodiment, as a result of the self-alignment phenomenon being produced appropriately, the gap between circuit components 4 and 5 after the reflow process can be reliably secured. Accordingly, it is not necessary to cover the bridge section 12 disposed between mounting sections 11 with a solder resist layer, thereby reducing the manufacturing cost of the circuit substrate 2. It is difficult to form a resin-made solder resist layer on a ceramic substrate since high-temperature firing is required for the ceramic substrate. However, even by the use of a ceramic substrate on which a resin-made solder resist layer is difficult to form, as a result of the self-alignment phenomenon being produced appropriately on the circuit substrate without a solder resist layer, the gap between circuit components 4 and 5 after the reflow process can be reliably secured.

Circuit components 4 and 5 may also be mounted on the second main surface of the circuit substrate 2, and a resin insulating layer for covering the circuit components 4 and 5 may also be provided on the second main surface.

The present disclosure can be widely used for a resin-sealed module formed by resin-sealing plural circuit components mounted on a circuit substrate.

1 resin-sealed module
2 circuit substrate
2a first main surface
4 circuit component
5 circuit component (chip component)
5a outer electrode
10, 100, 101 common land electrode
11 mounting section
12 bridge section
12a protruding portion
13 first land electrode
14 second land electrode
H solder
L straight line (imaginary line connecting the centers of mounting sections)
β line width

The invention claimed is:
1. A resin-sealed module having a plurality of circuit components sealed with a resin and mounted on a circuit substrate, comprising:
a plurality of common land electrodes located on a first main surface of the circuit substrate, outer electrodes of the plurality of circuit components set at a same potential being connected to one of the common land electrodes,
each of the common land electrodes including:
a plurality of mounting sections linearly disposed in a same direction relative to an imaginary line connecting centers of opposing ones of the mounting sections, and
a bridge section disposed in an area where the mounting sections are opposed to each other so as to interconnect opposing ones of the mounting sections, wherein
one of the outer electrodes of each of the circuit components is connected to a corresponding one of the mounting sections on a one-to-one correspondence basis by using a solder, and a portion of the bridge section disposed in the area where the mounting sections are opposed to each other is displaced in a direction perpendicular to the imaginary line connecting centers of opposing ones of the mounting sections.

2. The resin-sealed module according to claim 1, wherein, at an edge of the bridge section on a side on which the bridge section is displaced, a protruding portion is provided such that the protruding portion protrudes from the area where the mounting sections are opposed to each other.

3. The resin-sealed module according to claim 2, wherein, at an edge of the bridge section on a side opposite to the side on which the bridge section is displaced, a recessed portion is located such that the recessed portion curves inward toward the side on which the bridge section is displaced.

4. The resin-sealed module according to claim 3, wherein the recessed portion has an arc shape.

5. The resin-sealed module according to claim 1, wherein the bridge section is disposed between the circuit components connected to the mounting sections.

6. The resin-sealed module according to claim 1, wherein a line width of the bridge section is smaller than a width of the area where the mounting sections are opposed to each other.

7. The resin-sealed module according to claim 1, wherein the plurality of common land electrodes comprises two common land electrodes, and the mounting sections of each of the two common land electrodes is linearly disposed; and the plurality of circuit components comprises a plurality of rectangular-parallelepiped chip components, the outer electrode being located at each end portion of each of the chip components, wherein the mounting sections of one of the two common land electrodes and the mounting sections of another one of the two common land electrodes are disposed in parallel with each other, and the two common land electrodes are disposed line-symmetrical with each other so that a distance between the mounting sections of the two common land electrodes disposed in parallel with each other will be equal to a distance between the outer electrodes of each of the chip components and so that a distance between the bridge sections of the two common land electrodes will be different from the distance between the outer electrodes of each of the chip components, and the chip components are connected in parallel with each other by connecting one of the outer electrodes of each of the chip components to a corresponding one of the mounting sections of the two common land electrodes disposed in parallel with each other and by connecting another one of the outer electrodes of each of the chip components to another corresponding one of the mounting sections of the two common land electrodes disposed in parallel with each other.

8. The resin-sealed module according to claim 1, wherein two of the mounting sections of the common land electrode disposed in the same direction are interconnected by the bridge section, and the common land electrode comprises:

a first land electrode disposed in parallel with one of the mounting sections; and a second land electrode disposed in parallel with another one of the mounting sections; and the plurality of circuit components comprise two rectangular-parallelepiped chip components, the outer electrode being located at each end portion of each of the chip components, wherein the two chip components are connected in series with each other by connecting one of the outer electrodes of one of the chip components to one of the mounting sections and by connecting another one of the outer electrodes to the first land electrode and by connecting one of the outer electrodes of another one of the chip components to another one of the mounting sections and by connecting another one of the outer electrodes to the second land electrode.

9. The resin-sealed module according to claim 2, wherein the bridge section is disposed between the circuit components connected to the mounting sections.

10. The resin-sealed module according to claim 3, wherein the bridge section is disposed between the circuit components connected to the mounting sections.

11. The resin-sealed module according to claim 4, wherein the bridge section is disposed between the circuit components connected to the mounting sections.

12. The resin-sealed module according to claim 2, wherein a line width of the bridge section is smaller than a width of the area where the mounting sections are opposed to each other.

13. The resin-sealed module according to claim 3, wherein a line width of the bridge section is smaller than a width of the area where the mounting sections are opposed to each other.

14. The resin-sealed module according to claim 4, wherein a line width of the bridge section is smaller than a width of the area where the mounting sections are opposed to each other.

15. The resin-sealed module according to claim 5, wherein a line width of the bridge section is smaller than a width of the area where the mounting sections are opposed to each other.

16. The resin-sealed module according to claim 2, wherein the plurality of common land electrodes comprises two common land electrodes, and the mounting sections of each of the two common land electrodes is linearly disposed; and the plurality of circuit components comprises a plurality of rectangular-parallelepiped chip components, the outer electrode being located at each end portion of each of the chip components, wherein the mounting sections of one of the two common land electrodes and the mounting sections of another one of the two common land electrodes are disposed in parallel with each other, and the two common land electrodes are disposed line-symmetrical with each other so that a distance between the mounting sections of the two common land electrodes disposed in parallel with each other will be equal to a distance between the outer electrodes of each of the chip components and so that a distance between the bridge sections of the two common land electrodes will be different from the distance between the outer electrodes of each of the chip components, and the chip components are connected in parallel with each other by connecting one of the outer electrodes of each of the chip components to a corresponding one of the mounting sections of the two common land electrodes disposed in parallel with each other and by connecting another one of the outer electrodes of each of the chip components to another corresponding one of the mounting sections of the two common land electrodes disposed in parallel with each other.

17. The resin-sealed module according to claim 3, wherein
the plurality of common land electrode comprises two common land electrodes, and the mounting sections of each of the two common land electrodes is linearly disposed; and
the plurality of circuit components comprises a plurality of rectangular-parallelepiped chip components, the outer electrode being located at each end portion of each of the chip components, wherein
the mounting sections of one of the two common land electrodes and the mounting sections of another one of the two common land electrodes are disposed in parallel with each other, and the two common land electrodes are disposed line-symmetrical with each other so that a distance between the mounting sections of the two common land electrodes disposed in parallel with each other will be equal to a distance between the outer electrodes of each of the chip components and so that a distance between the bridge sections of the two common land electrodes will be different from the distance between the outer electrodes of each of the chip components, and
the chip components are connected in parallel with each other by connecting one of the outer electrodes of each of the chip components to a corresponding one of the mounting sections of the two common land electrodes disposed in parallel with each other and by connecting another one of the outer electrodes of each of the chip components to another corresponding one of the mounting sections of the two common land electrodes disposed in parallel with each other.

18. The resin-sealed module according to claim 4, wherein
the plurality of common land electrode comprises two common land electrodes, and the mounting sections of each of the two common land electrodes is linearly disposed; and
the plurality of circuit components comprises a plurality of rectangular-parallelepiped chip components, the outer electrode being located at each end portion of each of the chip components, wherein
the mounting sections of one of the two common land electrodes and the mounting sections of another one of the two common land electrodes are disposed in parallel with each other, and the two common land electrodes are disposed line-symmetrical with each other so that a distance between the mounting sections of the two common land electrodes disposed in parallel with each other will be equal to a distance between the outer electrodes of each of the chip components and so that a distance between the bridge sections of the two common land electrodes will be different from the distance between the outer electrodes of each of the chip components, and
the chip components are connected in parallel with each other by connecting one of the outer electrodes of each of the chip components to a corresponding one of the mounting sections of the two common land electrodes disposed in parallel with each other and by connecting another one of the outer electrodes of each of the chip components to another corresponding one of the mounting sections of the two common land electrodes disposed in parallel with each other.

19. The resin-sealed module according to claim 5, wherein
the plurality of common land electrode comprises two common land electrodes, and the mounting sections of each of the two common land electrodes is linearly disposed; and
the plurality of circuit components comprises a plurality of rectangular-parallelepiped chip components, the outer electrode being located at each end portion of each of the chip components, wherein
the mounting sections of one of the two common land electrodes and the mounting sections of another one of the two common land electrodes are disposed in parallel with each other, and the two common land electrodes are disposed line-symmetrical with each other so that a distance between the mounting sections of the two common land electrodes disposed in parallel with each other will be equal to a distance between the outer electrodes of each of the chip components and so that a distance between the bridge sections of the two common land electrodes will be different from the distance between the outer electrodes of each of the chip components, and
the chip components are connected in parallel with each other by connecting one of the outer electrodes of each of the chip components to a corresponding one of the mounting sections of the two common land electrodes disposed in parallel with each other and by connecting another one of the outer electrodes of each of the chip components to another corresponding one of the mounting sections of the two common land electrodes disposed in parallel with each other.

20. The resin-sealed module according to claim 6, wherein
the plurality of common land electrode comprises two common land electrodes, and the mounting sections of each of the two common land electrodes is linearly disposed; and
the plurality of circuit components comprises a plurality of rectangular-parallelepiped chip components, the outer electrode being located at each end portion of each of the chip components, wherein
the mounting sections of one of the two common land electrodes and the mounting sections of another one of the two common land electrodes are disposed in parallel with each other, and the two common land electrodes are disposed line-symmetrical with each other so that a distance between the mounting sections of the two common land electrodes disposed in parallel with each other will be equal to a distance between the outer electrodes of each of the chip components and so that a distance between the bridge sections of the two common land electrodes will be different from the distance between the outer electrodes of each of the chip components, and
the chip components are connected in parallel with each other by connecting one of the outer electrodes of each of the chip components to a corresponding one of the mounting sections of the two common land electrodes disposed in parallel with each other and by connecting another one of the outer electrodes of each of the chip components to another corresponding one of the mounting sections of the two common land electrodes disposed in parallel with each other.

* * * * *